United States Patent
Wang et al.

(10) Patent No.: US 9,209,045 B2
(45) Date of Patent: Dec. 8, 2015

(54) FAN OUT PACKAGE STRUCTURE AND METHODS OF FORMING

(71) Applicant: Taiwan Semiconductor Manufacturing Company, Ltd., Hsin-Chu (TW)

(72) Inventors: Pu Wang, Hsin-Chu (TW); Ying-Ching Shih, Taipei (TW); Szu-Wei Lu, Hsin-Chu (TW); Jing-Cheng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 138 days.

(21) Appl. No.: 14/081,853

(22) Filed: Nov. 15, 2013

(65) Prior Publication Data

US 2015/0137379 A1 May 21, 2015

(51) Int. Cl.
*H01L 23/532* (2006.01)
*H01L 21/56* (2006.01)
*H01L 21/768* (2006.01)
*H01L 23/525* (2006.01)
*H01L 23/31* (2006.01)

(52) U.S. Cl.
CPC .......... *H01L 21/56* (2013.01); *H01L 21/76801* (2013.01); *H01L 21/76895* (2013.01); *H01L 23/3114* (2013.01); *H01L 23/3192* (2013.01); *H01L 23/525* (2013.01); *H01L 23/53223* (2013.01); *H01L 23/53238* (2013.01)

(58) Field of Classification Search
CPC .............. H01L 21/56; H01L 21/76801; H01L 21/76895; H01L 23/3192; H01L 23/3114; H01L 23/525; H01L 23/53238; H01L 23/53223
See application file for complete search history.

(56) References Cited

U.S. PATENT DOCUMENTS 6,451,681 B1 * 9/2002 Greer ........................... 438/601
6,727,593 B2 * 4/2004 Toyoda et al. ................ 257/762

* cited by examiner

*Primary Examiner* — David Vu
(74) *Attorney, Agent, or Firm* — Slater & Matsil, L.L.P.

(57) ABSTRACT

An embodiment is a structure comprising a die having a pad on a surface and an encapsulant at least laterally encapsulating the die. The pad is exposed through the encapsulant. The structure further includes a first dielectric layer over the encapsulant and the die, a first conductive pattern over the first dielectric layer, and a second dielectric layer over the first conductive pattern and the first dielectric layer. The first dielectric layer and the second dielectric layer have a first opening to the pad of the die. The structure further includes a second conductive pattern over the second dielectric layer and in the first opening. The second conductive pattern adjoins a sidewall of the first dielectric layer in the first opening and a sidewall of the second dielectric layer in the first opening.

20 Claims, 6 Drawing Sheets

FAN OUT PACKAGE STRUCTURE AND METHODS OF FORMING

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies may also require smaller packages that utilize less area than packages of the past, in some applications.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a fan-out package structure. Other embodiments may also be applied, however, to other package structures. Figures and discussion below illustrate simplified structures so as to not obscure various features and to omit redundant features that would be apparent to a person of ordinary skill in the art. Like reference numbers in the figures refer to like components. Although method embodiments may be described as being performed in a particular order, other embodiments may be performed in any logical order.

Figure 1:
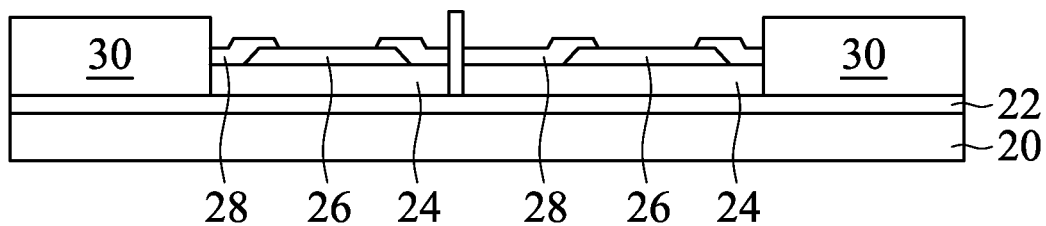
FIGS. 1 through 8 are various cross sectional views of structures during a first process according to an embodiment.

FIGS. 1 through 8 illustrate various cross sectional views of structures during a first process according to an embodiment. FIG. 1 illustrates two dies 24 with a surrounding molding compound 30 during processing. The dies 24 each comprise a pad 26, such as an aluminum pad, and a passivation layer 28 over a top surface of the die 24. The dies 24 may be, for example, a logic integrated circuit, a memory die, an analog die, or any other die. The dies 24 may comprise a semiconductor substrate, such as a bulk semiconductor substrate, semiconductor-on-insulator substrate, or the like, on which active devices, such as transistors, and/or passive devices, such as capacitors, inductors, or the like, are formed according to semiconductor processes. Metallization layers may be on the semiconductor substrate and may comprise interconnect structures to electrically couple devices together and/or to a pad 26.

In an example, the dies 24 are formed as part of a wafer. A sacrificial layer, which may comprise a dry film or a wet film formed by coating, laminating, printing, or the like, is formed over the passivation layer 28 and pad 26 of each die 24 of the wafer. The sacrificial layer can be cured by ultraviolet (UV) radiation, an oven process, or the like. The wafer is then singulated to form individual dies 24. The dies 24 are placed on a carrier substrate 20 using, for example, a pick-and-place tool, and the dies 24 are adhered to the carrier substrate 20 by a die attach film 22, such as any suitable adhesive, such as UV glue (which loses its adhesive property when exposed to UV lights), or film on wire (FOW) materials.

A molding compound 30 is formed at least laterally encapsulating the dies 24. The molding compound 30 may be formed using compression molding, lamination, or the like. The molding compound 30 may be an epoxy-based complex or the like. The molding compound 30 may be cured using, for example, a thermal process at a temperature between about 120° C. and about 330° C. The molding compound 30 may undergo a grinding process to expose the sacrificial layer over the dies 24. The sacrificial layer may be removed using a solvent, chemicals, or the like. In an example, a wet etch selective to the sacrificial layer, such as a dilute KOH solution that is, for example, about 3% to about 5% KOH, is used to remove the sacrificial layer. Thus, the structure illustrated in FIG. 1 may be formed.

Figure 2:
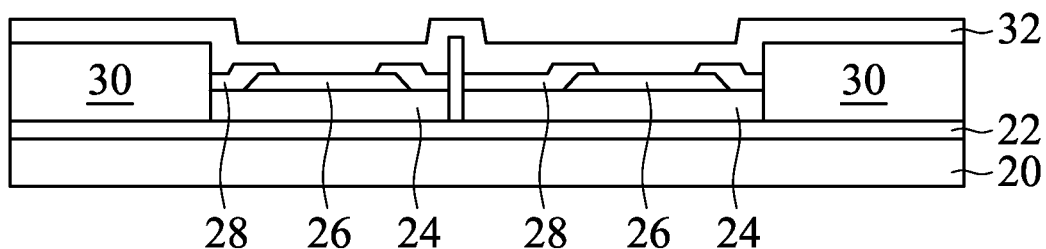

In FIG. 2, a first dielectric layer 32 is formed over the passivation layers 28 and pads 26 of the dies 24 and over the molding compound 30. The first dielectric layer 32 may comprise a polybenzoxazole (PBO), polyimide, benzocyclobutene (BCB), the like, or a combination thereof. The first dielectric layer 32 can be deposited by a spin coating process, laminating process, the like, or a combination thereof.

Figure 3:
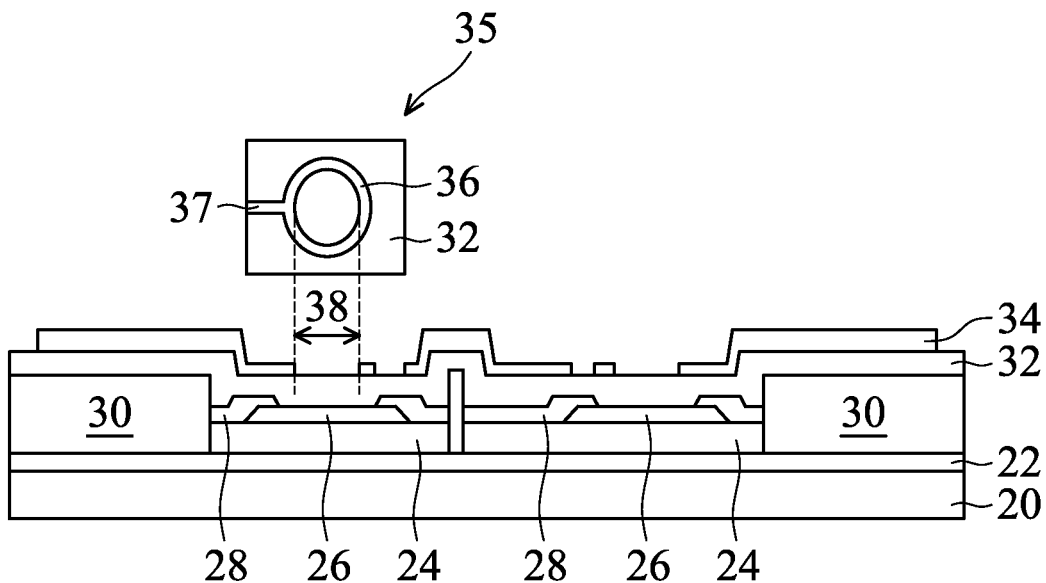

In FIG. 3, a first conductive layer 34 is formed on the first dielectric layer 32. The first conductive layer 34 comprises various traces. The inset 35 is a plan view and illustrates a trace 37 connected to a via connecting portion 36 formed directly over a respective pad 26. The via connecting portion 36 has an opening with a width 38. The via connecting portion 36 is illustrated as a ring or ring-like shape, and in other embodiments, the opening in the via connecting portion 36 may be a rectangular or square-like shape, a triangular shape, a hexagonal shape, an octagonal shape, or the like. Also, the via connecting portion 36 is illustrated as an enclosed shape, and in other embodiments, the via connecting portion 36 may be broken or disconnected.

The first conductive layer 34 in an example comprises a metal such as copper, titanium, the like, or a combination thereof, formed by a plating process, such as electroless plating, electroplating, or the like. For example, a seed layer is deposited over the first dielectric layer 32. The seed layer can be copper, titanium, a combination of copper and titanium (Ti/Cu), the like, or a combination thereof deposited by atomic layer deposition (ALD), sputtering, another physical vapor deposition (PVD) process, or the like. A photoresist is deposited and patterned exposing the pattern for the first conductive layer 34 that is desired, such as by an acceptable photolithography technique. A conductive material, such as copper, aluminum, the like, or a combination thereof, is deposited on the seed layer by electroless plating, electroplating, or the like. The photoresist is removed, such as an appropriate photoresist stripping process. Remaining exposed seed layer portions are removed, such as by a wet or dry etch.

Figure 4:
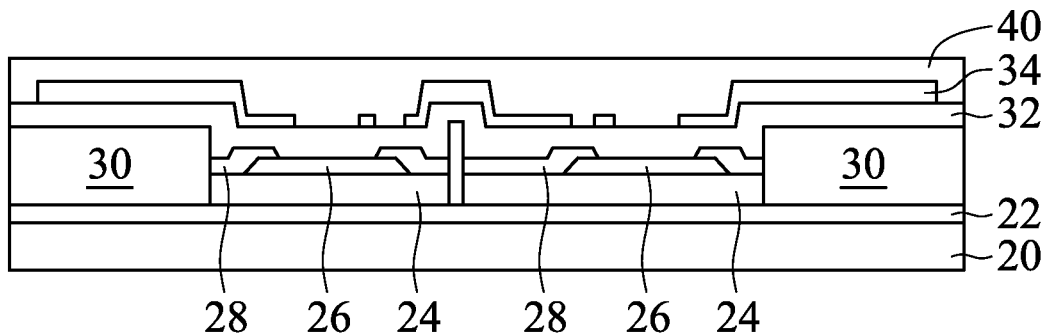

In FIG. 4, a second dielectric layer 40 is formed over the first dielectric layer 32 and the first conductive layer 34. The second dielectric layer 40 may comprise a PBO, polyimide, BCB, the like, or a combination thereof. The second dielectric layer 40 can be deposited by a spin coating process, laminating process, the like, or a combination thereof.

Figure 5:
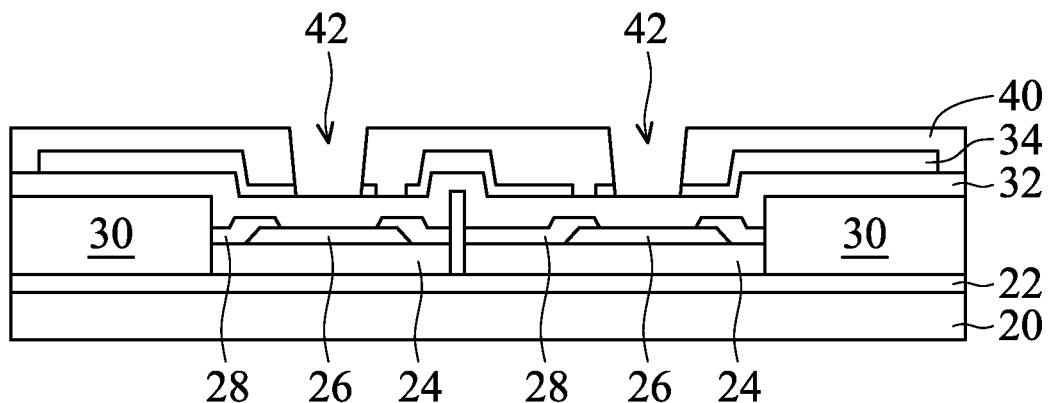

In FIG. 5, openings 42 are formed through the second dielectric layer 40 to the first dielectric layer 32 and/or the first conductive layer 34, such as to via connecting portions 36, using an acceptable photolithography technique, such as including exposing to light the portions of the second dielectric layer 40 where the openings 45 are to be formed.

Figure 6:
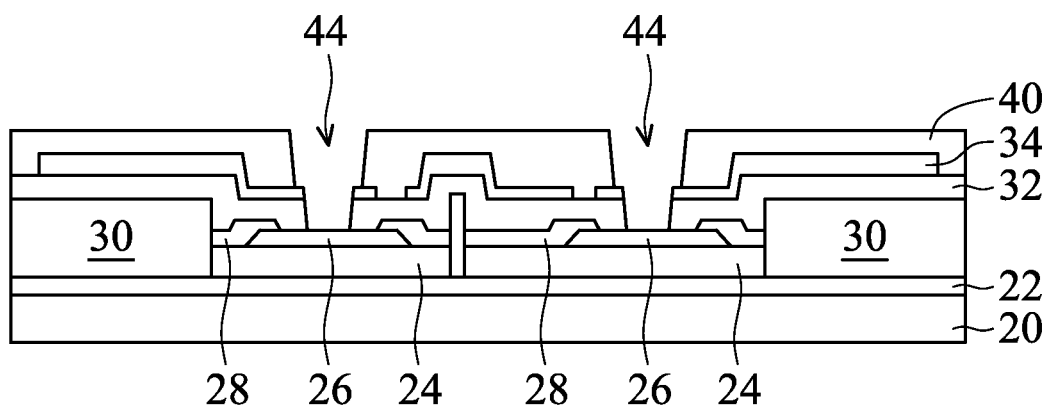

In FIG. 6, openings 44 are formed through the first dielectric layer 32 to the pads 26. In an example, the openings 44 are formed using an etching process. The etching can be anisotropic and can include a reactive ion etching (RIE), a capacitive coupled plasma (CCP) etching, an inductive coupled plasma (ICP), the like, or a combination thereof. In other examples, other acceptable methods may be used, such as laser drilling. The first conductive layer 34, such as the via connecting portion 36 may act as a mask during the removing the first dielectric layer 32 to form the openings 44.

Figure 7:
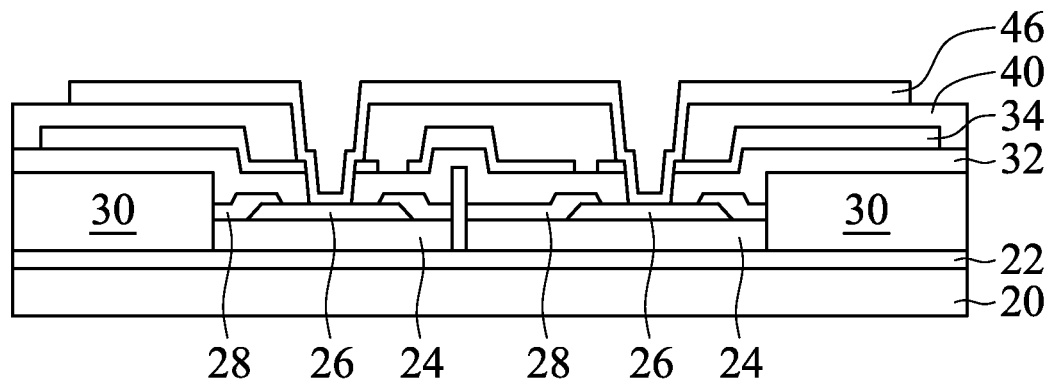

In FIG. 7, a second conductive layer 46 is formed on the second dielectric layer 40 and in the openings 44. The second conductive layer 46 comprises various traces and/or bond pads for balls. The second conductive layer 46 in an example comprises a metal such as copper, titanium, the like, or a combination thereof, formed by a plating process, such as electroless plating, electroplating, or the like. For example, a seed layer is deposited over the second dielectric layer 40 and in the openings 44. The seed layer can be copper, titanium, a combination of copper and titanium (Ti/Cu), the like, or a combination thereof deposited by ALD, sputtering, another PVD process, or the like. A photoresist is deposited and patterned exposing the pattern for the second conductive layer 46 that is desired, such as by an acceptable photolithography technique. A conductive material, such as copper, aluminum, the like, or a combination thereof, is deposited on the seed layer by electroless plating, electroplating, or the like. The photoresist is removed, such as an appropriate photoresist stripping process. Remaining exposed seed layer portions are removed, such as by a wet or dry etch. Vias are formed in the openings 44 that connect a respective pad 26, via connecting portion 36 of the first conductive layer 34, and a portion of the second conductive layer 46.

Figure 8:
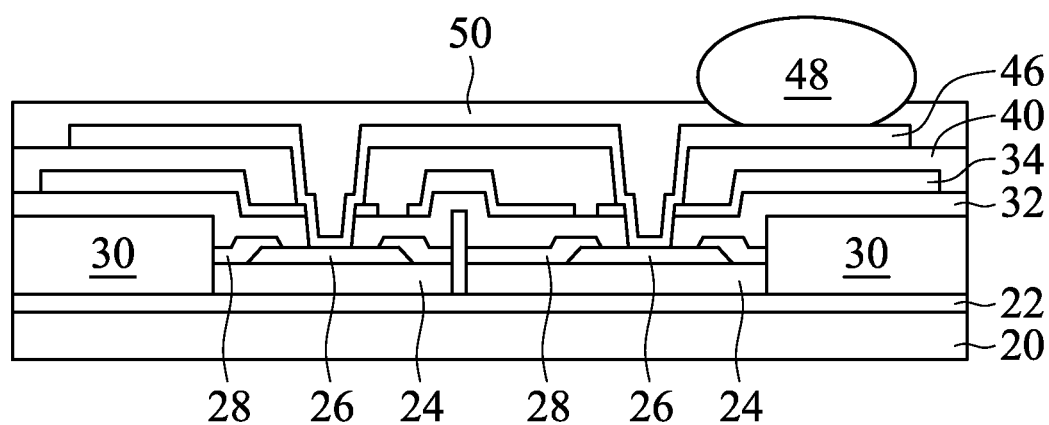

In FIG. 8, a ball 48 is formed on a bond pad of the second conductive layer 46. The ball 48 may comprise solder, such as lead-free solder, and may be formed using an acceptable ball drop process. A bracing material 50 may be formed over the second conductive layer 46 and the second dielectric layer 40 and around a portion of the ball 48. The bracing material 50 may comprise a molding compound or the like that provides structural support.

Figure 9:
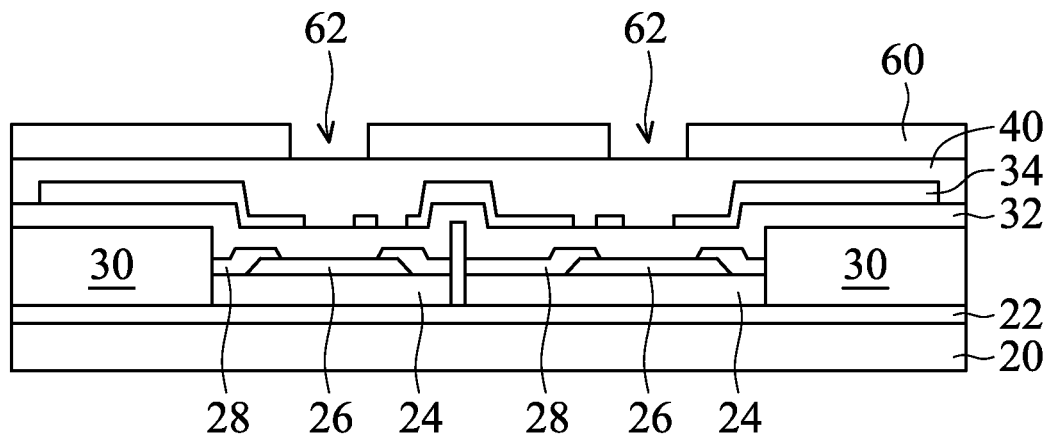
FIGS. 9 and 10 are various cross sectional views of structures during a second process according to an embodiment.
Figure 10:
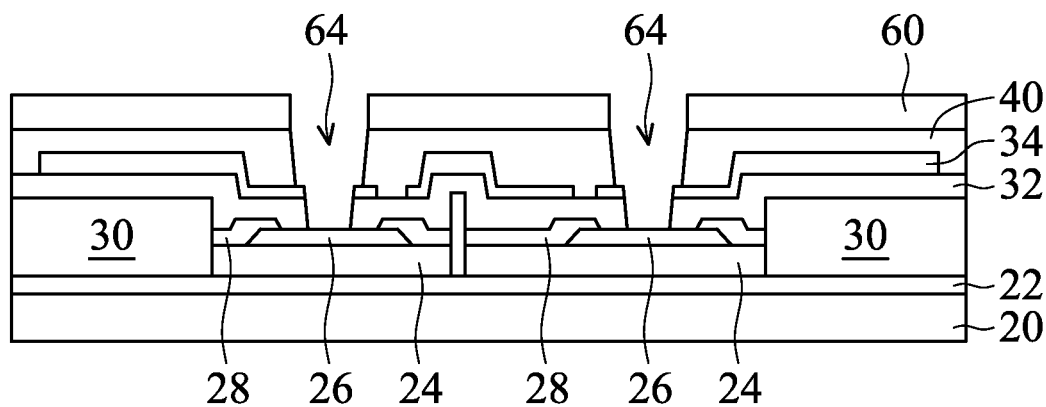

FIGS. 9 and 10 illustrate various cross sectional views of structures during a second process according to an embodiment. The second process proceeds through FIGS. 1 through 4 as discussed above. In FIG. 9, a mask layer 60 having openings 62 is formed over the second dielectric layer 40. The mask layer 60 may comprise silicon nitride, silicon oxynitride, a photosensitive film (a dry film or a wet film), the like, or a combination thereof, and may be formed using a chemical vapor deposition (CVD), coating, laminating, the like, or a combination thereof. The openings 62 can be formed using an acceptable photolithography and etching process, such as using RIE, CCP, ICP, the like, or a combination thereof. In this embodiment, the second dielectric layer 40 may be formed with an initial thickness less than that in the first process because, for example, the mask layer 60 may prevent a loss of thickness of the second dielectric layer 40 when forming the openings 64 as compared to the formations of openings 44 in FIG. 6.

In FIG. 10, openings 64 are formed through the second dielectric layer 40 and the first dielectric layer 32 to the pads 26 using the mask layer 60. In an example, the openings 64 are formed using an etching process through the second dielectric layer 40 and the first dielectric layer 32. The etching can be anisotropic and can include RIE, CCP, ICP, the like, or a combination thereof. In other examples, other acceptable methods may be used, such as laser drilling. The first conductive layer 34, such as the via connecting portion 36 may act as a mask during the removing the first dielectric layer 32 to form the openings 64. The mask layer 60 may be removed after forming the openings 64, such as by using an etch that is selective to the mask layer 60. The second process then continues through FIGS. 7 and 8 as discussed above.

In each of the first and second processes, the carrier substrate 20 may be removed, such as by exposing the die attach film 22 to a solvent or UV light. Hence, a package may comprise a structure as illustrated in FIG. 8 without the carrier substrate 20 and the die attach film 22.

Figure 11:
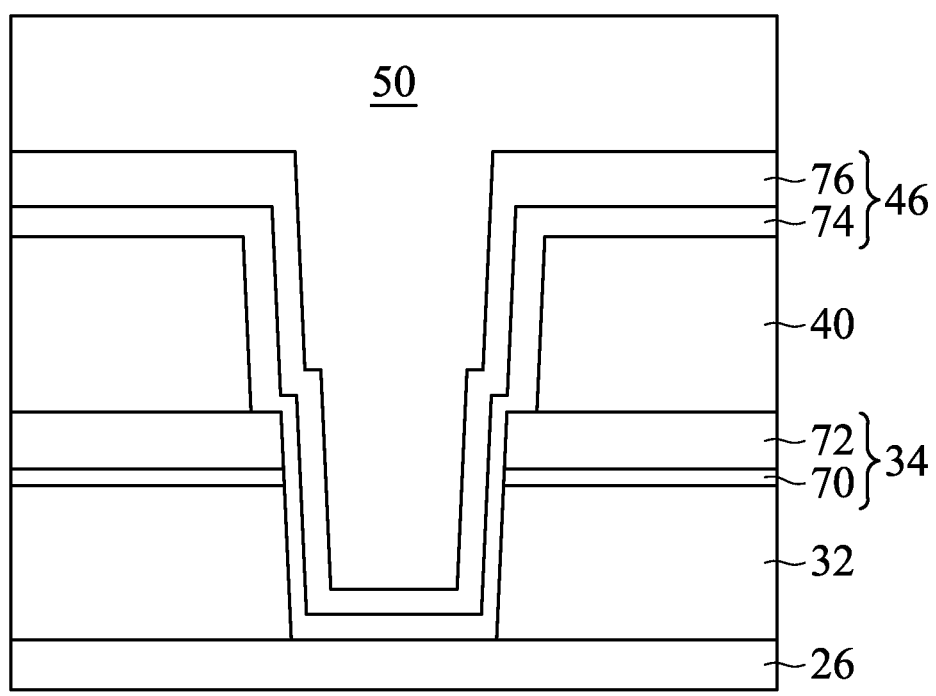
FIG. 11 is an expanded view of a via according to an embodiment.

FIG. 11 illustrates an expanded view of a via formed according to the processes discussed above. As shown, the first conductive layer 34 includes a first seed layer 70 and a first main layer 72, and the second conductive layer 46 includes a second seed layer 74 and a second main layer 76. The first conductive layer 34, which includes the via connecting portion 36, extends along a top surface of the first dielectric layer 32 and does not extend along sidewalls of the first dielectric layer 32. The second conductive layer 46 extends along a top surface of the second dielectric layer 40, adjoins sidewalls of the second dielectric layer 40, the first conductive layer 34 (e.g., the via connecting portion 36), and the first dielectric layer 32, and adjoins a top surface of the pad 26. The bracing material 50 may fill any unfilled portion of the via, for example, as shown in FIG. 11.

Embodiments may achieve advantages. For example, by having a via formed with only one conductive layer along sidewalls of an opening, an aspect ratio of the via may be decreased. This may decrease an opening size of the via. Thus, a pad on the die may be smaller. Additionally, costs may be reduced using some embodiments.

An embodiment is a structure comprising a die having a pad on a surface and an encapsulant at least laterally encapsulating the die. The pad is exposed through the encapsulant. The structure further includes a first dielectric layer over the encapsulant and the die, a first conductive pattern over the first dielectric layer, and a second dielectric layer over the first conductive pattern and the first dielectric layer. The first dielectric layer and the second dielectric layer have a first opening to the pad of the die. The structure further includes a second conductive pattern over the second dielectric layer and in the first opening. The second conductive pattern adjoins a sidewall of the first dielectric layer in the first opening and a sidewall of the second dielectric layer in the first opening.

Another embodiment is structure comprising a package and an external electrical connector on the package. The package comprises a die comprising a pad, an encapsulant around the die, and a dielectric multi-layer structure over the die and the encapsulant. The dielectric multi-layer structure comprises a first conductive pattern in the dielectric multi-layer structure and a second conductive pattern on the dielectric multi-layer structure. A first opening is defined through the dielectric multi-layer structure to the pad. At least a portion of the first conductive pattern defines at least a portion of the first opening. At least a portion of the second conductive pattern is in the first opening and adjoins sidewalls of the dielectric multi-layer structure. The first conductive pattern does not extend along the sidewalls of the dielectric multi-layer structure in the first opening.

A further embodiment is a method comprising encapsulating a die with an encapsulant, a pad of the die being exposed through the encapsulant; forming a first dielectric layer over the encapsulant and the die; forming a first conductive pattern over the first dielectric layer; forming a second dielectric layer over the first conductive pattern and the first dielectric layer; after forming the first conductive pattern and the second dielectric layer, forming an opening through the second dielectric layer and the first dielectric layer to the pad; and forming a second conductive pattern over the second dielectric layer and in the opening.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   encapsulating a die with an encapsulant, a pad of the die being exposed through the encapsulant;
   forming a first dielectric layer over the encapsulant and the die;
   forming a first conductive pattern over the first dielectric layer;
   forming a second dielectric layer over the first conductive pattern and the first dielectric layer;
   after forming the first conductive pattern and the second dielectric layer, forming an opening through the second dielectric layer and the first dielectric layer to the pad; and
   forming a second conductive pattern over the second dielectric layer and in the opening.

2. The method of claim 1, wherein the first conductive pattern comprises a connecting portion, the connecting portion being used as a mask when forming the opening through the first dielectric layer.

3. The method of claim 1, wherein the first conductive pattern comprises a connecting portion, the connecting portion comprises a ring.

4. The method of claim 1 wherein the forming the opening comprises:
   lithographically patterning the second dielectric layer; and
   etching the first dielectric layer.

5. The method of claim 1, wherein the forming the opening comprises:
   forming a mask over the second dielectric layer; and
   etching the second dielectric layer and the first dielectric layer.

6. The method of claim 1, wherein the second conductive pattern in the opening adjoins sidewalls of the first dielectric layer and the second dielectric layer.

7. The method of claim 1 further comprising:
   forming an external electrical connector electrically coupled to the second conductive pattern; and
   forming a bracing material over the second dielectric layer and the second conductive pattern and around at least a portion of the external electrical connector.

8. A method comprising:
   forming an encapsulant at least laterally around a die;
   forming a first dielectric layer on the encapsulant and the die;
   forming a first conductive pattern on the first dielectric layer, a first opening being through the first conductive pattern;
   forming a second dielectric layer on the first conductive pattern and the first dielectric layer;
   forming a second opening through the second dielectric layer, the first dielectric layer, and the first opening; and
   forming a second conductive pattern on the second dielectric layer and in the second opening, the second conductive pattern contacting a sidewall of the first opening of the first conductive pattern.

9. The method of claim 8, wherein a conductive pad is on the die, the second opening being formed to the conductive pad.

10. The method of claim 8, wherein the first opening has a circular shape.

11. The method of claim 8, wherein the first conductive pattern is continuous laterally around the first opening.

12. The method of claim 8, wherein the first conductive pattern is discontinuous laterally around the first opening.

13. The method of claim 8, wherein the forming the second opening comprises:
   lithographically patterning the second dielectric layer; and
   etching the first dielectric layer using the first conductive pattern as a mask.

14. The method of claim 8, wherein the forming the second opening comprises:
   forming a mask on the second dielectric layer; and
   etching the second dielectric layer and the first dielectric layer.

15. A method comprising:
   encapsulating a die with an encapsulant, the die having a conductive pad;
   forming an interconnect structure on the die and the encapsulant, the interconnect structure being electrically coupled to the conductive pad, the forming the interconnect structure comprising:
   forming a first dielectric layer,
   forming a first conductive pattern on the first dielectric layer, the first conductive pattern having a connecting portion,
   forming a second dielectric layer on the first conductive pattern and the first dielectric layer, forming an opening through the second dielectric layer, the connecting portion, and the first dielectric layer to a conductive feature, and forming a second conductive pattern on the second dielectric layer and in the opening, the second conductive pattern contacting respective sidewalls of the second dielectric layer, the connecting portion, and the first dielectric layer defining the opening and contacting the conductive feature; and forming an external electrical connector on the interconnect structure.

16. The method of claim 15, wherein the conductive feature is the conductive pad of the die.

17. The method of claim 15, wherein the connecting portion is continuous laterally around the opening.

18. The method of claim 15, wherein the connecting portion is discontinuous laterally around the opening.

19. The method of claim 15, wherein the forming the opening comprises:
lithographically patterning the second dielectric layer; and
etching the first dielectric layer using the connecting portion as a mask.

20. The method of claim 15, wherein the forming the opening comprises:
forming a mask on the second dielectric layer; and
etching the second dielectric layer and the first dielectric layer.

* * * * *